United States Patent
Chung

(12) 
(10) Patent No.: US 6,819,143 B1
(45) Date of Patent: Nov. 16, 2004

(54) INPUT BUFFER CIRCUIT HAVING EQUAL DUTY CYCLE

(75) Inventor: Tae-Song Chung, Danville, CA (US)

(73) Assignee: Silicon Bridge, Inc., Fremont, CA (US)

( * ) Notice: Subject to any disclaimer, the term of this patent is extended or adjusted under 35 U.S.C. 154(b) by 0 days.

(21) Appl. No.: 10/388,138

(22) Filed: Mar. 13, 2003

(51) Int. Cl.$^7$ .................................................. G01R 19/00

(52) U.S. Cl. .......................... 327/52; 327/359; 330/253

(58) Field of Search ............................. 327/52, 53, 57, 327/359; 330/252, 253

(56) References Cited

U.S. PATENT DOCUMENTS 6,373,782 B1 * 4/2002 Ikeda .................... 365/230.08

* cited by examiner

Primary Examiner—Kenneth B. Wells
(74) Attorney, Agent, or Firm—William L. Paradice, III

(57) ABSTRACT

An input buffer circuit includes a first differential circuit, a second differential circuit, a pull-up circuit, and a pull-down circuit. An input voltage and a reference voltage are provided to the first and second differential circuits. The first differential circuit detects rising edges of the input voltage and causes the pull-up circuit to quickly drive an output voltage to logic high. The second differential circuit detects falling edges of the input voltage and causes the pull-down circuit to quickly drive the output voltage to logic low.

18 Claims, 5 Drawing Sheets

US 6,819,143 B1

INPUT BUFFER CIRCUIT HAVING EQUAL DUTY CYCLE

FIELD OF INVENTION

The present invention relates generally to semiconductor circuits and specifically to input buffer circuits for driving high speed signals.

DESCRIPTION OF RELATED ART

FIG. 1 shows a typical input buffer circuit 100 for use in High Speed Transceiver Logic (HSTL) applications. Input buffer circuit 100 includes a differential pair formed by NMOS transistors 102 and 104, a current source 106, and a current mirror formed by PMOS transistors 108 and 110. An input signal $V_{in}$ is provided to the gate of transistor 102, and a reference voltage $V_{ref}$ is provided to the gate of transistor 104. Current source 106 provides a constant bias current $I_{bias}$ for the differential pair 102 and 104. In response to a voltage differential between $V_{in}$ and $V_{ref}$, the differential pair 102 and 104 generates a single-ended output signal at node 112. A well-known buffer 114 coupled to node 112 drives an output waveform $V_{out}$ in response to the voltage signal at node 112.

The currents $I_{102}$ and $I_{104}$ in transistors 102 and 104, respectively, change in response to the differential voltage between $V_{in}$ and $V_{ref}$. The sum of currents $I_{102}$ and $I_{104}$ always equals $I_{bias}$. In addition, the common mode voltage $V_{cm}$ between transistors 102 and 104 tracks the average of $V_{in}$ and $V_{ref}$, i.e., $V_{cm}=(V_{in}+V_{ref})/2-V_T$, where $V_T$ is the threshold voltage for the differential pair. When transistors 102 and 104 are matched, currents $I_{102}$ and $I_{104}$ are both equal to $I_{bias}/2$ when $V_{in}$ and $V_{ref}$ are equal. Capacitor 116 models the parasitic capacitance at the common mode voltage $V_{CM}$ node.

When $V_{in}$ transitions to logic high, i.e., when $V_{in}>V_{ref}$, transistor 104 turns off and transistor 102 conducts nearly all of $I_{bias}$. If transistors 108 and 110 are matched, transistor 110 will mirror the current $I_{102}$ so that $I_{110}=I_{102}$. Because transistor 104 is non-conductive, the current $I_{110}$ charges node 112 toward $V_{DD}$. In response thereto, buffer 114 transitions $V_{out}$ to logic high. Conversely, when $V_{in}$ transitions to logic low, i.e., when $V_{in}<V_{ref}$, transistor 102 turns off and transistor 104 conducts nearly all of $I_{bias}$. Because transistor 102 is non-conductive, transistor 110 mirrors a negligible amount of current, i.e., $I_{110}\approx0$. As a result, the current $I_{104}$ discharges node 112 toward ground potential. In response thereto, buffer 114 transitions $V_{out}$ to logic low.

Referring also to the illustrative timing diagram of FIG. 2, the rise time of node 112 for low-to-high transitions of $V_{in}$ is much faster than the fall time of node 112 for high-to-low transitions of $V_{in}$. For example, when $V_{in}$ transitions to logic high at time t1, transistor 102 quickly turns on, and the resultant mirrored current $I_{110}$ quickly charges output node 112 toward $V_{DD}$. In response thereto, buffer 114 quickly drives $V_{out}$ to logic high just after time t1. The logic high level of $V_{in}$ causes the common mode voltage $V_{cm}$ to increase, albeit more slowly than $V_{in}$ (because of the parasitic capacitance 116), which in turn causes a decrease in the gate to source voltages $V_{gs}$ of transistor 104. Thus, when $V_{in}$ transitions to logic low at time t2, the $V_{gs}$ of transistor 104 increases slowly because $V_{cm}$ is slow to transition. Specifically, as $V_{in}$ transitions to logic low, transistor 104 does not turn on until $V_{cm}$ falls at least one threshold voltage below $V_{ref}$. Because $V_{cm}$ does not fall as quickly as $V_{in}$, there is a delay in transistor 104 turning on to discharge output node 112 toward ground potential, and thus buffer 114 does not drive $V_{out}$ to logic low until time t3.

The delay (t3–t2) in FIG. 2 driving $V_{out}$ to logic low undesirably alters the duty cycle of the output waveform $V_{out}$, which in turn may lead to downstream logic and/or timing errors. In addition, the delay in driving $V_{out}$ to logic low may undesirably limit the speed of circuit 100. Note that if the NMOS differential pair 102 and 104 is replaced by a PMOS differential pair, the fall time of $V_{out}$ will be faster than the rise time $V_{out}$, which also undesirably alters the duty cycle of the output waveform $V_{out}$. For the circuit 100 of FIG. 1, the duty cycle error may be 10% or more. Therefore, there is a need for an input buffer circuit that is able to effect fast yet balanced output waveform transitions.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

In accordance with the present invention, an input buffer circuit is disclosed that processes high speed signals without altering their duty cycle(s). As a result, downstream errors resulting from duty cycle errors may be eliminated. In the following description, exemplary embodiments are described in order to provide a thorough understanding of the present invention. However, it is to be understood that the present invention is rot limited to the specific examples provided herein. For example, although described in the context of a single-ended input signal, buffer circuits in accordance with the present invention are equally applicable to differential input signals. Further, the logic states of various signals described herein are exemplary and therefore may be reversed or otherwise modified as generally known in the art. Additionally, the size and polarity of transistors for embodiments described herein may be reversed or otherwise altered as may be desired.

Figure 3:
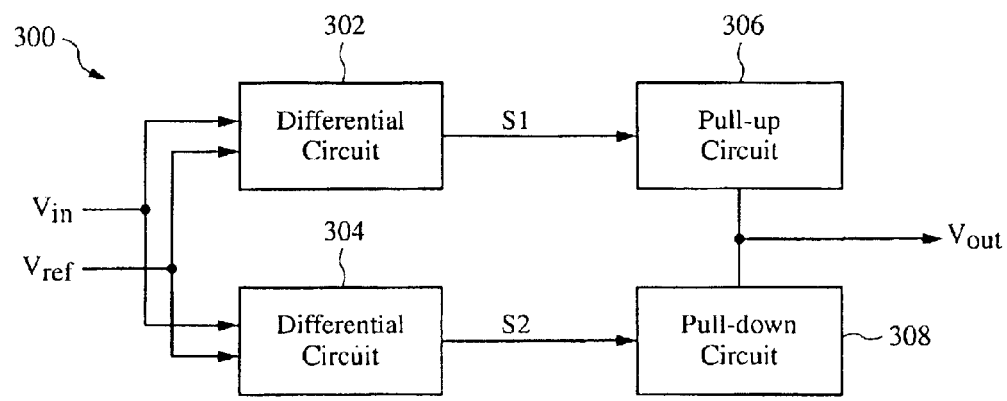
FIG. 3 is a block diagram of an input buffer circuit in accordance with the present invention.

FIG. 3 shows an input buffer circuit 300 in accordance with one embodiment of the present invention. Circuit 300 includes a first differential circuit 302, a second differential circuit 304, a pull-up circuit 306, and a pull-down circuit 308. An input voltage $V_{in}$ and a reference voltage $V_{ref}$ are provided to the first and second differential circuits 302 and 304. The single-ended input signal $V_{in}$ is referenced to $V_{ref}$, which may be any suitable voltage. For some embodiments, $V_{ref}$ is approximately one-half the supply voltage (not shown) for input buffer circuit 300. For one embodiment, $V_{ref}$ is generated from the supply voltage using a well-known voltage divider circuit.

In response to $V_{in}$ and $V_{ref}$, first differential circuit 302 provides a first control signal S1 to pull-up circuit 306, and second differential circuit 304 provides a second control signal S2 to pull-down circuit 308. Pull-up circuit 306 and pull-down circuit 308 control the logic state of output waveform $V_{out}$ in response to control signals S1 and S2, respectively, in a manner that preserves the duty cycle of input waveform $V_{in}$.

For one embodiment, first differential circuit 302 is optimized to respond to low-to-high logic transitions of $V_{in}$, and second differential circuit 304 is optimized to respond to high-to-low logic transitions of $V_{in}$. For example, when $V_{in}$ transitions to logic high, e.g., when $V_{in} > V_{ref}$, first differential circuit 302 quickly asserts first control signal S1, which in turn causes pull-up circuit 306 to turn on and quickly charge $V_{out}$ toward the supply voltage, e.g., to logic high. Concurrently, second differential circuit 304 de-asserts second control signal S2, which in turn causes pull-down circuit 308 to turn off and prevent $V_{out}$ from discharging.

When $V_{in}$ transitions to logic low, e.g., when $V_{in} > V_{ref}$, second differential circuit 304 quickly asserts second control signal S2, which in turn causes pull-down circuit 308 to turn on and quickly discharge $V_{out}$ toward ground potential, e.g., to logic low. Concurrently, first differential circuit 302 de-asserts first control signal S1, which in turn causes pull-up circuit 306 to turn off and prevent $V_{out}$ from charging.

By using first differential circuit 302 to quickly transition $V_{out}$ to logic high in response to low-to-high transitions of $V_{in}$, first differential circuit 302 may be optimized for responding to rising edges of $V_{in}$. Similarly, by using second differential circuit 304 to quickly transition $V_{out}$ to logic low in response to high-to-low transitions of $V_{in}$, second differential circuit 304 may be optimized for responding to falling edges of $V_{in}$. In this manner, the rise and fall times of $V_{out}$ may be minimized, which in turn allows input buffer circuit 300 to be used in high speed communication applications. In addition, the first and second differential circuits 302 and 304 may be sized relative to each other so that the rise and fall times of $V_{out}$ are equal, thereby preserving the duty cycle of $V_{in}$.

Figure 4:
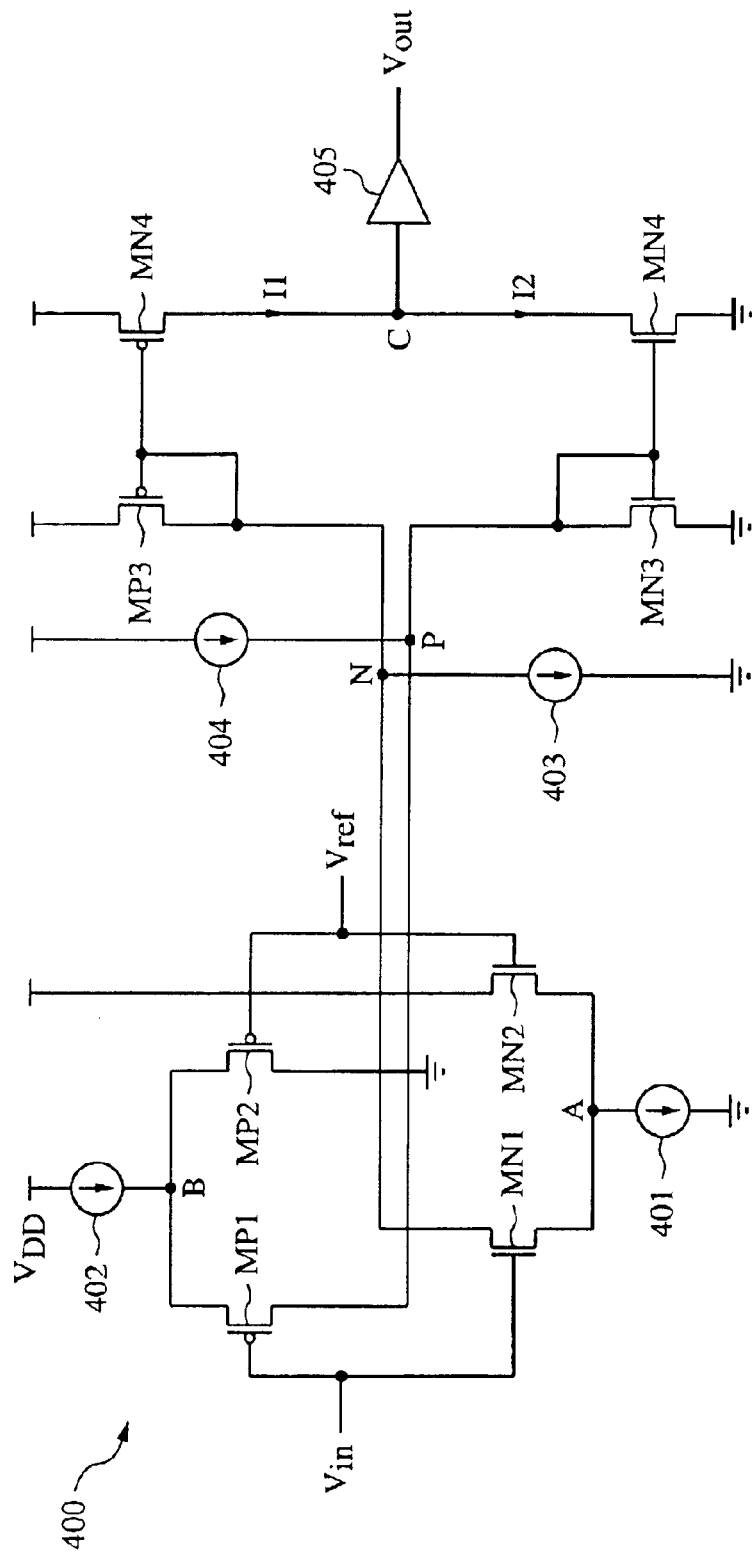
FIG. 4 is a circuit diagram of one embodiment of the input buffer circuit of FIG. 3.

FIG. 4 shows an input buffer circuit 400 that is one embodiment of buffer 300 of FIG. 3. NMOS transistor MN1 is coupled between a bias node A and a control node N, and has a gate to receive the input signal $V_{in}$. NMOS transistor MN2 is coupled between bias node A and a supply voltage $V_{DD}$, and has a gate to receive the reference voltage $V_{ref}$. Together, transistors MN1 and MN2 form a differential pair that provides a single-ended output signal at node N in response to the voltage differential between $V_{ref}$ and $V_{in}$. The differential pair MN1 and MN2, which responds more quickly to rising edges of $V_{in}$ than to falling edges of $V_{in}$, is used to quickly trigger low-to-high transitions of $V_{out}$ in response to $V_{in}$. Current source 401, which is coupled between bias node A and ground potential, provides a bias current $I_{bias\_n}$ to NMOS differential pair MN1 and MN2. For one embodiment, $I_{bias\_n}$ is approximately 120 µA.

PMOS transistor MP3 is a diode-connected transistor coupled between $V_{DD}$ and node N. PMOS transistor MP4 is coupled between $V_{DD}$ and an output node C, and has a gate coupled to the gate of transistor MP3. Together, transistors MP3 and MP4 form a current mirror between node N and output node C. A current source 403 coupled between node N and ground potential forward biases transistor MP3 by charging the gate of transistors MP3 and MP4 toward ground potential with a small constant current $I_{403}$. In this manner, transistors MP3 and MP4 quickly mirror current flow in transistor MN1, for example, when signal S1 of FIG. 3 is asserted. For one embodiment, current 1403 is approximately 10 µA. For other embodiments, current source 403 may be eliminated.

PMOS transistor MP1 is coupled between a bias node B and a control node P, and has a gate to receive $V_{in}$. PMOS transistor MP2 is coupled between bias node B and ground potential, and has a gate to receive $V_{ref}$. Together, transistors MP1 and MP2 form a differential pair that provides a single-ended output signal at node P in response to the voltage differential between $V_{ref}$ and $V_{in}$. The differential pair MP1 and MP2, which responds more quickly to falling edges of $V_{in}$ than to rising edges of $V_{in}$, is used to quickly trigger high-to-low transitions of $V_{out}$ in response to $V_{in}$. A current source 402 coupled between $V_{DD}$ and bias node B provides a bias current $I_{bias\_p}$ to PMOS differential pair MP1 and MP2. For one embodiment, $I_{bias\_p}$ is approximately 120 µA.

NMOS transistor MN3 is a diode-connected transistor coupled between node P and ground potential. NMOS transistor MN4 is coupled between output node C and ground potential, and has a gate coupled to the gate of transistor MN3. A current source 404 coupled between node P and $V_{DD}$ forward biases transistor MN3 by charging the gate of transistor MN3 toward $V_{DD}$ with a small constant current $I_{404}$. In this manner, transistors MN3 and MN4 quickly mirror current flow in transistor MP1, for example, when signal S2 of FIG. 3 is asserted. For one embodiment, current $I_{404}$ is approximately 10 µA. For other embodiments, current source 404 may be eliminated.

A buffer 405 is coupled between output node C and an output terminal of circuit 400. Buffer 405 may be any suitable circuit that drives $V_{out}$ in response to output node C. For the exemplary embodiment of FIG. 4, buffer 405 is non-inverting buffer. For another embodiment, buffer 405 is a CMOS inverter.

For some embodiments, differential pair MN1 and MN2 is the first differential circuit 302 of FIG. 3, differential pair MP1 and MP2 is the second differential circuit 304 of FIG. 3, the current mirror formed by transistors MP3 and MP4 is the pull-up circuit 306 of FIG. 3, and the current mirror formed by transistors MN3 and MN4 is the pull-down circuit 308 of FIG. 3.

Figure 5:
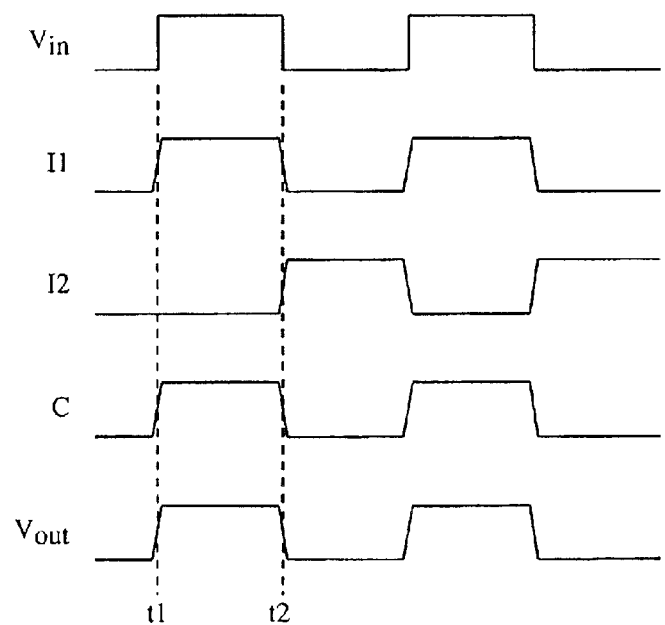
FIG. 5 is a timing diagram representing exemplary input and output waveforms for the input buffer circuit of FIG.

Operation of input buffer circuit 400 is described below with respect to the illustrative timing diagram of FIG. 5. When $V_{in}$ goes high at time t1, e.g., when $V_{in} > V_{ref}$, transistor MN1 turns on, and transistor MN2 turns off. Because the $V_{cm}$ for differential pair MN1 and MN2 is relatively low prior to the rising edge of $V_{in}$, transistor MN1 turns on very quickly. The bias current $I_{bias\_n}$ conducted by transistor MN1 is quickly mirrored by transistor MP4 as current I1. The rising edge of $V_{in}$ also causes transistor MP1 to turn off and transistor MP2 to turn on. Because transistor MP1 is non-conductive, only the relatively small current $I_{404}$ is mirrored by transistor MN4 as current I2. Therefore, because the charge current I1 is much larger than the discharge current I2, output node C is quickly charged toward $V_{DD}$, which in turn causes buffer 405 to quickly transition $V_{out}$ to logic high just after time t1. For some embodiments, the current $I_{403}$ is sufficiently small to not disturb the transition of $V_{out}$ e.g., $I_{401} >> I_{403}$.

When $V_{in}$ goes low at time t2, e.g., when $V_{in} < V_{ref}$, transistor MP1 turns on, and transistor MP2 turns off.

Because the $V_{cm}$ for differential pair MP1 and MP2 is relatively high prior to the falling edge of $V_{in}$, transistor MP1 turns on very quickly. The bias current $I_{bias\_p}$ conducted by transistor MP1 is quickly mirrored by transistor MN4 as current 12. The falling edge of $V_{in}$ also causes transistor MN1 to turn off and transistor MN2 to turn on. Because transistor MN1 is non-conductive, only the relatively small current $I_{403}$ is mirrored by transistor MP4 as current I1. Therefore, because the discharge current I2 is much larger than the charge current I1, output node C is quickly discharged toward ground potential, which in turn causes buffer 405 to quickly transition $V_{out}$ to logic low just after time t2. For some embodiments, the current 1404 is sufficiently small to not disturb the transition of $V_{out}$, e.g., $I_{402} \gg I_{404}$.

Thus, differential pair MN1 and MN2 achieves a fast transition of $V_{out}$ from logic low to logic high in response to rising edges of $V_{in}$, and differential pair MP1 and MP2 achieves a fast transition of $V_{out}$ from logic high to logic low in response to falling edges of $V_{in}$. The use of separate differential pairs for detecting rising and falling edges of $V_{in}$ allows the output signal $V_{out}$ to have very fast rising and falling edges, which in turn makes input buffer circuit 400 suitable for high speed applications where maintaining an equal or constant duty cycle is important. For one embodiment, input buffer circuit 400 may process signals having frequencies up to 1 Gigahertz. In addition, because these differential pairs are separate, they may be similarly scaled so that the rise and fall times of $V_{out}$ match each other and mirror those of $V_{in}$, thereby preserving the duty cycle of $V_{in}$. Therefore, for some embodiments, transistors MN1, MN2, MP1, and MP2 are scaled to have the same current-carrying ability, and transistors MN3, MN4, MP3, and MP4 are scaled to have the same current-carrying ability. For some embodiments, circuit 400 achieve a duty cycle error of less than 1%.

Figure 1:
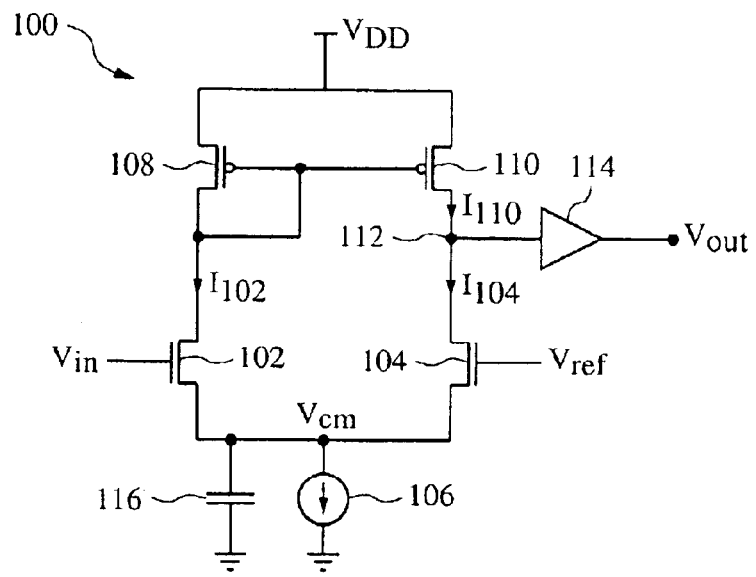
FIG. 1 is a circuit diagram of a conventional input buffer circuit for use in high speed transceiver logic applications.
Figure 2:
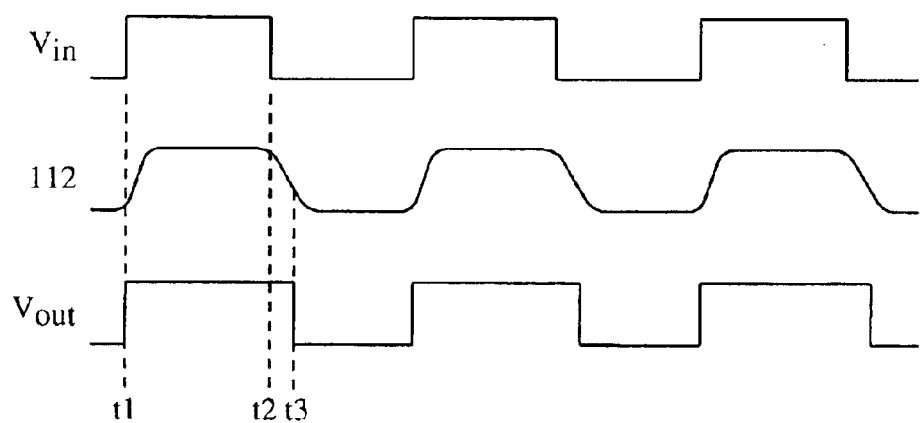
FIG. 2 is a timing diagram representing exemplary input and output waveforms for the circuit of FIG. 1.
Figure 6A:
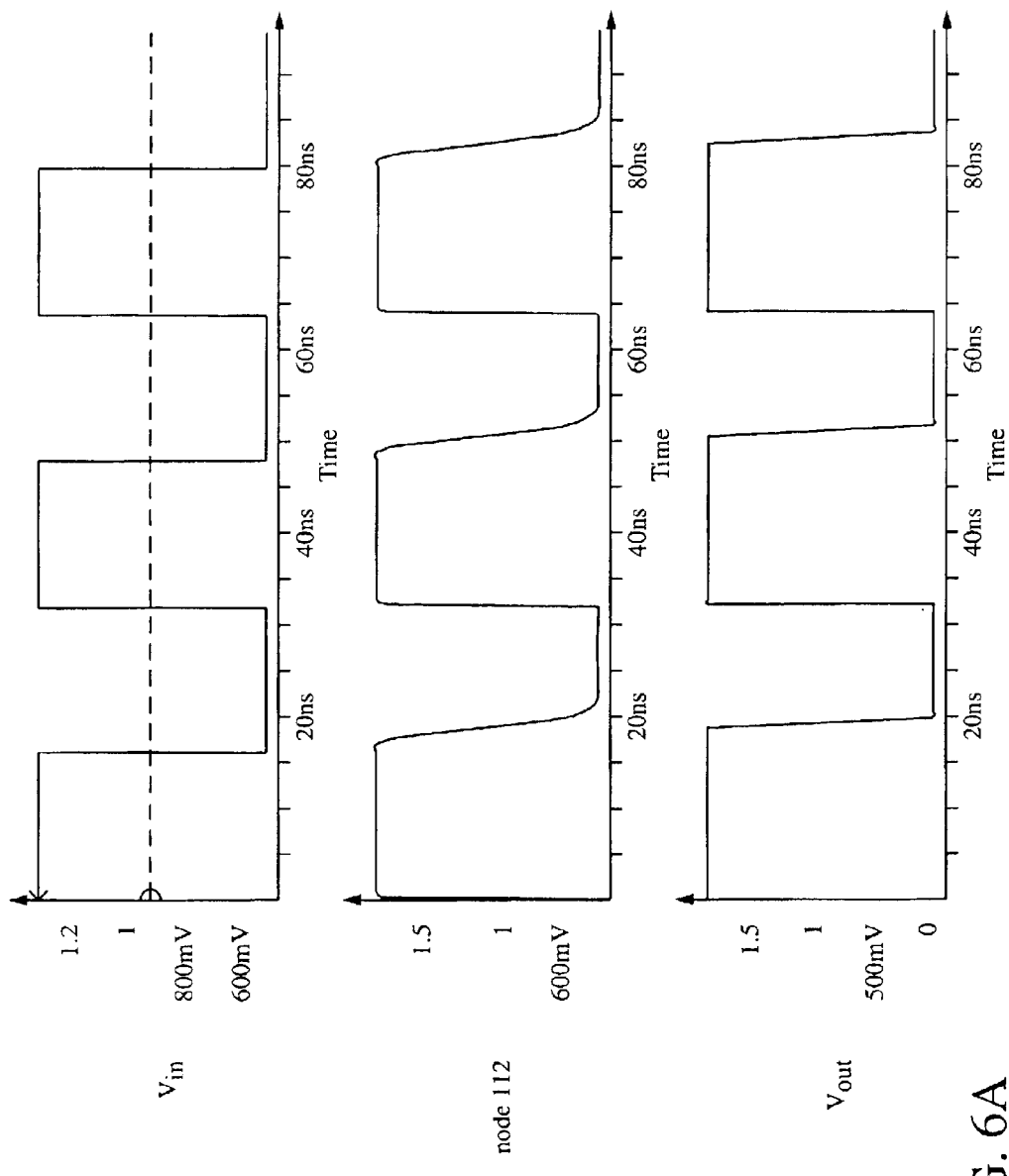
FIGS. 6A and 6B are timing diagrams illustrating input and output waveforms produced during simulations of prior art circuit 100 of FIG. 1 and one embodiment of circuit 400 of FIG. 4, respectively.

FIG. 6A shows signal waveforms for $V_{in}$, node 112, and $V_{out}$ generated during simulation of prior art input buffer circuit 100. Both $V_{in}$ and $V_{out}$ transition from low to high at time (t)=0 ns. However, while the first high-to-low transition of $V_{in}$ occurs at approximately t=18 ns, the first high-to-low transition of $V_{out}$ occurs at approximately t=20 ns (because of the slow high-to-low transition of node 112, as discussed above with respect to FIGS. 1 and 2). Thus, for the simulation illustrated in FIG. 6A, prior art buffer circuit 100 undesirably increases the duty cycle of the input signal waveform by approximately 10%.

Figure 6B:
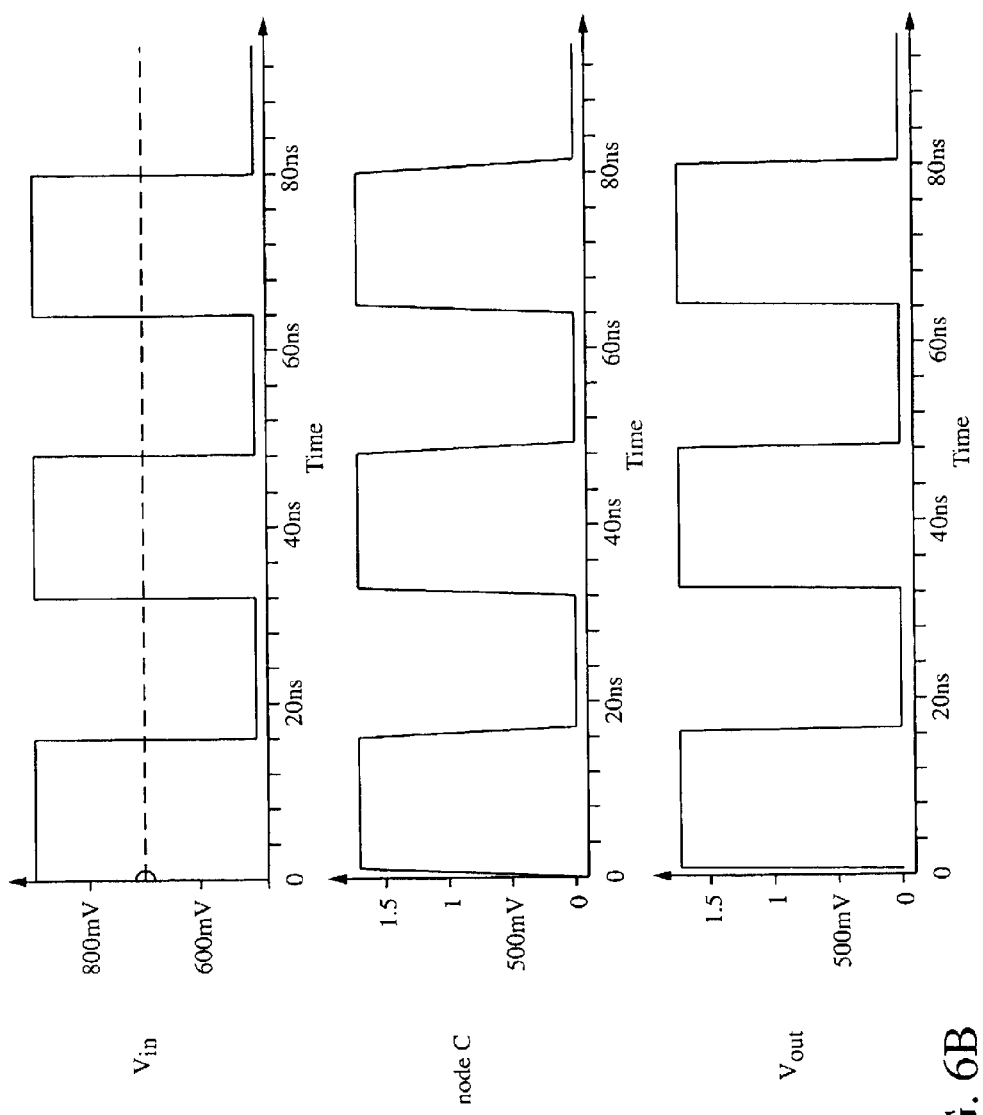

FIG. 6B shows signal waveforms for $V_{in}$, node C, and $V_{out}$ generated during simulation of one embodiment of input buffer circuit 400. Both $V_{in}$ and $V_{out}$ transition from low to high at t=0 ns. However, in contrast to prior art circuit 100, the first high-to-low transition of $V_{in}$ and $V_{out}$ each occur at approximately t=18 ns, thereby preserving the duty cycle of the input signal waveform.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An input buffer circuit, comprising:
   a first differential circuit having a first input to receive an input voltage, a second input to receive a reference voltage, and a single-ended output to provide a first control signal indicative of a voltage differential between the input voltage and the reference voltage;
   a second differential circuit having a first input to receive the input voltage, a second input to receive the reference voltage, and a single-ended output to provide a second control signal indicative of the voltage differential between the input voltage and the reference voltage;
   a first current mirror coupled between the single-ended output of the first differential circuit and an output node; and
   a second current mirror coupled between the single-ended output of the second differential circuit and the output node.

2. The circuit of claim 1, wherein the first current mirror charges the output node towards a supply voltage in response to the first control signal indicating a low-to-high transition of the input voltage, and the second current mirror discharges the output node towards ground potential in response to the second control signal indicating a high-to-low transition of the input voltage.

3. The circuit of claim 2, wherein the first and second control signals comprise current signals at the single-ended outputs of the first and second differential circuits, respectively.

4. The circuit of claim 1, further comprising:
   a first current source coupled between ground potential and the single-ended output of the first differential circuit; and
   a second current source coupled between the supply voltage and the single-ended output of the second differential circuit.

5. The circuit of claim 4, wherein the first current source maintains the first current mirror in a conductive state, irrespective of the first control signal, and the second current source maintains the second current mirror in a conductive state, irrespective of the second control signal.

6. The circuit of claim 1, wherein the first differential circuit comprises:
   a first NMOS transistor having a gate to receive the input voltage, a source coupled to a first bias node, and a drain coupled to the single-ended output of the first differential circuit; and
   a second NMOS transistor having a gate to receive the reference voltage, a source coupled to the first bias node, and a drain coupled to the supply voltage.

7. The circuit of claim 6, wherein the second differential circuit comprises:
   a first PMOS transistor having a gate to receive the input voltage, a source coupled to a second bias node, and a drain coupled to the single-ended output of the second differential circuit; and
   a second PMOS transistor having a gate to receive the reference voltage, a source coupled to the second bias node, and a drain coupled to ground potential.

8. The circuit of claim 7, wherein the first current mirror comprises:
   a third PMOS transistor having a gate and drain coupled to the single-ended output of the first differential circuit, and having a source coupled to the supply voltage; and
   a fourth PMOS transistor having a gate coupled to the single-ended output of the first differential circuit, a drain coupled to the output node, and a source coupled to the supply voltage.

9. The circuit of claim 8, wherein the second current mirror comprises:
a third NMOS transistor having a gate and drain coupled to the single-ended output of the second differential circuit, and having a source coupled to ground potential; and
a fourth NMOS transistor having a gate coupled to the single-ended output of the second differential circuit, a drain coupled to the output node, and a source coupled to ground potential.

10. An input buffer circuit, comprising:
a first NMOS transistor having a gate to receive an input voltage, a source coupled to a first bias node, and a drain coupled to a first control node;
a second NMOS transistor having a gate to receive a reference voltage, a source coupled to the first bias node, and a drain coupled to a supply voltage;
a first PMOS transistor having a gate to receive the input voltage, a source coupled to a second bias node, and a drain coupled to a second control node,
a second PMOS transistor having a gate to receive the reference voltage, a source coupled to the second bias node, and a drain coupled to ground potential;
a third PMOS transistor having a gate and drain coupled to the first control node, and having a source coupled to the supply voltage;
a fourth PMOS transistor having a gate coupled to the first control node, a drain coupled to an output node, and a source coupled to the supply voltage;
a third NMOS transistor having a gate and drain coupled to the second control node, and having a source coupled to ground potential;
a fourth NMOS transistor having a gate coupled to the second control node, a drain coupled to the output node, and a source coupled to ground potential;
a first current source coupled between sound potential and the first control node; and
a second current source coupled between the supply voltage and the second control node, wherein the first current source forward biases the third PMOS transistor, and the second current source forward biases the third NMOS transistor.

11. The circuit of claim 10, wherein the fourth PMOS transistor mirrors current conducted by the first NMOS transistor when the input voltage transitions to a logic high state to quickly charge the output node to the logic high state.

12. The circuit of claim 11, wherein the fourth NMOS transistor does not conduct any current when the input voltage transitions to the logic high state.

13. The circuit of claim 12, wherein the fourth NMOS transistor mirrors current conducted by the first PMOS transistor when the input voltage transitions to a logic low state to quickly discharge the output node to the logic low state.

14. The circuit of claim 13, wherein the fourth PMOS transistor does not conduct any current when the input voltage transitions to the logic low state.

15. An input buffer circuit, comprising:
first differential means for detecting a rising edge of an input signal comprising a single-ended signal referenced to a reference signal, pull-up means for driving an output signal to logic high in response to the first differential means;
second differential means for detecting a falling edge of the input signal; and
pull-down means for driving the output signal to logic low in response to the second differential means; wherein:
the first differential means comprises a first differential circuit having a first input to receive the input signal, a second input to receive the reference signal, and a single-ended output to provide a first control signal; and
the second differential means comprises a second differential circuit having a first input to receive the input signal, a second input to receive the reference signal, and a single-ended output to provide a second control signal.

16. The circuit of claim 15, wherein:
the pull-up means comprises a first current mirror coupled between the single-ended output of the first differential circuit and an output node; and
the pull-down means comprises a second current mirror coupled between the single-ended output of the second differential circuit and the output node.

17. The circuit of claim 16, further comprising:
means for maintaining the pull-up means in a conductive state; and
means for maintaining the pull-down means in a conductive state.

18. The circuit of claim 17, wherein:
the means for maintaining the pull-up means in a conductive state comprises a third current source coupled between ground potential and the single-ended output of the first differential circuit; and
the means for maintaining the pull-down means in a conductive state comprises a fourth current source coupled between the supply voltage and the single-ended output of the second differential circuit.

* * * * *